United States Patent [19]

Nagel et al.

[11] Patent Number: 5,655,955
[45] Date of Patent: Aug. 12, 1997

[54] METHOD AND TOOL FOR IMPROVING THE STRUCTURE OF THE INNER FACES OF WORKING CHAMBERS OF MACHINES AND MOTORS

[75] Inventors: Wolf Nagel, Nürtingen; Hans Kuhn, Köln, both of Germany

[73] Assignee: Nagel Maschinen und Werekzeugfabrik GmbH, Nutrigen, Germany

[21] Appl. No.: 282,756

[22] Filed: Jul. 29, 1994

[30] Foreign Application Priority Data

Jul. 30, 1993 [DE] Germany ............ 43 25 520.5

[51] Int. Cl.⁶ ............................................ B24B 7/00
[52] U.S. Cl. ............................ 451/124; 451/155
[58] Field of Search ............... 451/213, 11, 27, 451/51, 481, 153, 150, 124, 156, 19, 464, 25, 155

[56] References Cited

U.S. PATENT DOCUMENTS

| | | | |
|---|---|---|---|
| 2,128,706 | 8/1938 | Hunt et al. | 451/150 |
| 3,586,339 | 6/1971 | Demuth . | |
| 3,702,043 | 11/1972 | Welbourn et al. | 451/213 |
| 4,145,845 | 3/1979 | Ebelt | 451/153 |
| 4,155,201 | 5/1979 | Amundsen | 451/150 |
| 4,173,847 | 11/1979 | Gehring et al. | 451/481 |
| 4,180,945 | 1/1980 | Zimmerman | 451/150 |
| 4,189,871 | 2/1980 | Rottler et al. | 451/156 |
| 4,234,275 | 11/1980 | Clement | 451/51 |
| 4,423,567 | 1/1984 | Raven, III | 451/124 |
| 4,551,947 | 11/1985 | Grimm et al. | 451/155 |
| 4,557,640 | 12/1985 | Rottler | 451/155 |
| 4,577,611 | 3/1986 | Hagino . | |
| 4,945,685 | 8/1990 | Kajitani et al. | 451/124 |
| 5,085,014 | 2/1992 | Sandhof | 451/481 |
| 5,088,237 | 2/1992 | Nagel et al. | 451/51 |
| 5,155,944 | 10/1992 | Nagel et al. | 451/51 |

FOREIGN PATENT DOCUMENTS

| | | |
|---|---|---|
| 154626 | 10/1938 | Austria . |
| 483713 | 5/1992 | European Pat. Off. . |
| 1478253 | 12/1939 | Germany . |
| 704467 | 3/1941 | Germany . |
| 276809 | 10/1951 | Germany . |

(List continued on next page.)

OTHER PUBLICATIONS

"Honen" publication by Nagel.
Englisch, C.: Kolbenringe, Bd.1, Springer Verlag Wien 1958, S.421–437.
DE–AN G 2364 47f, 22/70 –15.5 1952.
Englisch, C: Das Einlaufen von Kolbenringen und seine Verbesserung durch Oberflachen–behandlungsverfahren in ATZ Automobiltechnik Zeitschrift 1939, H.24, 648–652.
"The Honing Process" Barnes Drill Co., Rockford, Illinois
Abstract of Japan, vol. 13, No. 360 (M-858) (3708) 11. Aug. 1989.

*Primary Examiner*—James G. Smith
*Assistant Examiner*—Derris H. Banks
*Attorney, Agent, or Firm*—Quarles & Brady

[57] ABSTRACT

In place of conventional machining of cylinder paths or tracks of piston engines, a honing machining without a rotary component is performed at least as a final machining operation so that the remaining small honing tracks are directed longitudinally and consequently permit an improved running-in behavior in conjunction with the piston rings. A preferred honing tool this has honing segments taking up a large circumferential portion and which are preferably resiliently constructed in Such a way that they automatically adapt to the cylinder path. A coating of components in the vicinity or working chambers, such as internal combustion chambers, e.g. of piston rings, comprises a chemically inert, anti-adhesive metal, such as e.g. niobium or zirconium. It is applied in a target process in vacuo and has a small thickness of approximately 8 micrometers. Together with the final machining by honing in the axial direction and in conjunction with a corresponding cylinder path, there is an improved running-in behavior, lower pollutant formation, better sealing and oil scraping.

23 Claims, 1 Drawing Sheet

FOREIGN PATENT DOCUMENTS

| | | | |
|---|---|---|---|
| 837041 | 4/1952 | Germany . | |
| 1069980 | 11/1959 | Germany . | |
| 1084094 | 6/1960 | Germany . | |
| 1087872 | 8/1960 | Germany . | |
| 974365 | 12/1960 | Germany . | |
| 1848781 | 3/1962 | Germany . | |
| 1872219 | 5/1963 | Germany . | |
| 1882791 | 11/1963 | Germany . | |
| 1215440 | 4/1966 | Germany . | |
| 1214933 | 4/1966 | Germany . | |
| 1292446 | 6/1966 | Germany . | |
| 1222748 | 8/1966 | Germany . | |
| 1953020 | 1/1967 | Germany . | |
| 1251589 | 10/1967 | Germany . | |
| 1264146 | 3/1969 | Germany . | |
| 1750250 | 1/1971 | Germany . | |
| 2244029 | 3/1973 | Germany . | |
| 2157030 | 5/1973 | Germany . | |
| 2201445 | 7/1973 | Germany . | |
| 7921071 | 7/1979 | Germany . | |
| 2934027 | 4/1980 | Germany . | |
| 2841722 | 4/1980 | Germany . | |
| 2931116 | 5/1980 | Germany . | |
| 2853542 | 6/1980 | Germany . | |
| 3017907 | 11/1980 | Germany . | |
| 3041225 | 6/1981 | Germany . | |
| 3045772 | 9/1981 | Germany . | |
| 3502143 | 8/1985 | Germany . | |
| 3607972 | 9/1987 | Germany . | |
| 387440 | 1/1989 | Germany . | |
| 3812656 | 1/1989 | Germany . | |
| 3813617 | 10/1989 | Germany . | |
| 9010077 | 10/1990 | Germany . | |
| 4226335 | 2/1994 | Germany . | |
| 4226335 | 10/1994 | Germany | 451/51 |
| 339429 | 8/1959 | Switzerland . | |

… 
METHOD AND TOOL FOR IMPROVING THE STRUCTURE OF THE INNER FACES OF WORKING CHAMBERS OF MACHINES AND MOTORS

BACKGROUND OF THE INVENTION

Holes and bores, particularly the inner faces of cylinders, such as the working cylinders of machines and motors, are honed in order to provide a specific surface quality and structure. It is ensured that the cross tracks exist such as are normally obtained with a simultaneous rotary and axial movement of the honing tools and they normally have a crossing angle between 30° and 90°.

The honing cross tracks, which remain detectable in the surface structure, are intended to form "oil pockets", with the aim of permitting a better holding or retaining of lubricating oil on the cylinder surface so as to reduce wear. As a result of this honing, the service life of motors and machines and, in particular, internal combustion engines, can be significantly increased despite higher rotational speeds and piston speeds.

In addition, numerous coatings have been proposed with a view to improving the running and wear characteristics of piston rings. Thus, according to DE-OS 38 12 656 a composite nickel coating is plated on. DE-OS 35 02 143 proposes hardening by nitriding the outer coating in the case of a stainless steel ring. DE-OS 30 41 225 describes flame-spraying with a material comprising ferrochromium, as well as nickel-chromium-cobalt or molybdenum. Also according to DE-OS 30 17 907 a metal carbide and molybdenum are applied by flame-spraying. DE-OS 2841 722 proposes the application by plasma jet of an oxide ceramic material, such as titanium dioxide or alumina. According to German utility model 18 82 791, an alumina is applied for improving the wear behavior and is covered by a soft running-in coating made from an unspecified material.

German utility model 19 53 020 proposes a coating formed from a porous, wear-resistant material, such as molybdenum or titanium by flame-spraying. According to Austrian patent 154 626, the piston ring material pores are to be filled with soft metal. In German patent 837 041, lead bronze is applied to a steel base material.

DE-OS 12 15 440 proposes a chromium coating with a running-in material formed from copper, zinc, bronze, or plastic inserted in grooves. DE-OS 38 13 617 uses copper, tin, or zinc on a chromium substrate.

In all of these cases, it was a question of obtaining an improved running-in behavior without reducing wear resistance.

OBJECTS OF THE INVENTION

One object of the invention is to bring about a further improvement to the service life and more particularly of components such as piston rings cooperating with the inner faces. Preferably there is also to be an improvement with a view to lower frictional losses and reduced pollutant expulsion.

Another object of the invention is to optimize the wear resistance, running-in behaviour and sliding friction, and this is also directed at improving the sealing function, mechanical behaviour and pollutant expulsion.

These objects are achieved by claims 1, 5 and 30.

SUMMARY OF THE INVENTION

As a result of the axial honing of the cylinder inner faces according to the invention, i.e. honing with a preponderantly axially directed machining movement, the honing tracks are positioned axially on the cylinder inner face. It has surprisingly been found that despite the omission of the "oil pockets", which were hitherto considered unavoidable for achieving satisfactory operation, the service life characteristics are better than in the hitherto known constructions. In particular, the frictional losses are reduced, so that there are lower energy losses and therefore a lower consumption and pollutant expulsion in the case of internal combustion engines. Pollutant expulsion is reduced by a lower lubricant combustion, because, on the axially honed cylinder tracks or paths, there is a better scraping of the lubricant by oil scraping rings and the like and consequently said lubricant does not enter the combustion area. As a result of the reduced friction, there is a lower temperature rise in the cylinder path and, more particularly, in the piston rings cooperating therewith. Under favorable conditions it is even possible to use less piston rings, i.e. two instead of three.

The "oil pockets" were hitherto considered so important that, e.g. in the case of chromium-plated cylinder paths, artificial depressions were made. Due to the lack of transverse channels, with the longitudinally honed cylinder path in accordance with the invention there is a type of "aquaplaning", because the oil cannot be laterally pressed away into the channels, so that smaller lubricant quantities are adequate. The components cooperating in axially oscillating manner with the cylinder, such as pistons and piston rings, particularly in the case of a corresponding material adaptation, can assume a miroform which corresponds to the axially honed surface. Thus, in a relatively short time and without significant wear, a grinding or running-in process can take place, in which the two slidingly cooperating parts are ideally matched to one another. This is not possible to the same extent with the hitherto honed surfaces through the cross-microsection, or at least only occurs with a higher wear level due to the "filing action" of the honing channels.

The outer face of hydraulic piston rods undergoes axial honing in order to protect the rubber sleeves cooperating therewith. However, this did not concern the oil retention problem or that of machining the inner faces of holes.

Axial honing is preferably performed without any machining movement in the circumferential direction. In order to achieve a certain uniform action both with respect to the macroform of the tool and the microstructure of the honing layers, during machining, or preferably after a few machining strokes, a honing tool can be rotated in another circumferential position, accompanied by a relief of the working pressure, i.e. without leaving behind circumferential channels. As a function of requirements, it is also possible to perform axial honing with an extremely small rotary component, so that the machining tracks hardly differ from the axial direction.

It is also possible to follow normal honing by axial honing as a final working operation. This is particularly appropriate if, through the honing, other machining tracks or imprecisions are to be compensated. The material removal is increased as a result of superimposed axial and rotary movements in the case of conventional honing. As a result of the following axial honing, it is still possible to produce the axial structure of the surface or to superimpose a cross-structure in such a way that the advantages of both methods and structures are combined.

The honing tool according to the invention is so constructed that its honing segments are adapted in their circumferential contour to the contour of the machining faces. This is important for adapting the tool to the particular machining diameter and in particular during the machining of successive workpieces, which have different diameters and/or shapes of the hole within the framework of machining tolerances. The adaptability of the honing segments ensures that specific areas of the honing segments, e.g. the outer edges or central area, do not receive higher contact pressures than the remaining areas and, consequently, there is no non-uniform, circumferential machining, which would be compensated with normal honing by the rotary component. This adaptation can take place through an elastic construction of the honing segments, which are so matched that the segments uniformly give way under the machining pressure and consequently give rise to identical machining pressures. For example, in the case of a honing layer having a relatively large circumferential area, e.g. ¼ of the circumference and which is centrally supported on an adjusting device, the elasticity increases towards the edge, so as to compensate the lever action exerted by the outer areas and the pressing conditions modified by cambering. The elastic design of the honing segments can e.g. be brought about by notches on the back surface, but could also take place individually by spring-mounted honing segments.

Although the adaptation problems are less in the case of narrower honing segments, it is preferable to give said segments a very large surface, e.g. with only four or six segments on the circumference, because as a result there are fewer gaps between the segments, which in the case of axial honing would leave behind unworked points. This can still be compensated by a multiple further rotation of the honing tool during the overall machining process, by inclining the gaps or segments, or by the arrangement in the axial direction of successive groups of honing tools with offset gaps.

A cylinder, particularly a working cylinder of motors and machines and with particular preference for internal combustion engines, which according to the invention has axially directed honing tracks, helps to significantly improve the service life and, in particular, reduces the energy and lubricant consumption, as well as the production of pollutants.

In addition, a coating of components in working chambers of motors and machines is proposed, which is formed from a chemically inert, anti-adhesive metal. This metal can come from the fourth or fifth secondary group of the periodic system of elements and in particular can be niobium or zirconium. Tantalum, hafnium and tungsten are also suitable. Iridium, palladium and platinum would also be suitable, but are very expensive. With certain limitations titanium is suitable, but is relatively soft.

If the component is a piston ring, it is possible to use as the base material an iron-based cast material, which is normally very hard. The material should also be sought in conjunction with the cooperating material of the cylinder path. The coating can be applied to an axially honed surface and can optionally be axially honed itself.

The coating is particularly suitable in conjunction with a cylinder path or track, which as a result of axial honing does not have the usual cross-machining tracks and, instead, has axial machining tracks. It has been found that this measure, particularly if it is supported by the fact that also the piston rings and/or their coating as a result of an axial final machining have such a track configuration, leads to a significantly improved running-in behaviour. Whereas in the case of normal honing cross tracks the running-in requires a "finish grinding" of the entire cylinder path, with prior longitudinal machining in conjunction with the coating only a reciprocal adaptation is necessary, which is also assisted by a reciprocal "digging in", so that the cylinder path is only slightly influenced.

Therefore such great significance is not attached to the hardness, wear resistance and sliding friction of the individual materials or the hardness conditions in the pair of materials, because as a result of the reciprocal adaptation less friction occurs and there is more rapidly a hydrodynamic bearing under the action of a very thin oil film.

In particular, as a result of the anti-adhesive characteristics of the material there is a reduced oil carbon formation. The chemical inertness of the coating materials used prevents the formation of carbonyls, which result from the reaction of metals through carbon monoxide, remove the metal and are also pollutants.

The coating should be applied in a target process (PVD arc process), i.e. a coating in which the metal is applied by arc plasma coating in vacuo.

Although certain of the characteristics are mainly important in connection with the piston ring surface facing the cylinder path, the coating can also take place on other sides, where the anti-adhesive and chemical inert action of the coating lead to advantages, in that less combustion residues can be applied and react with the metal. The coating also has the advantage that it compensates or fills small surface unevennesses, whilst at the same time having good sliding friction characteristics.

As a result of the described reciprocal adaptation, the sealing action and oil scraping by said coated piston ring are improved, so that possibly one of the conventionally three piston rings used may become superfluous. This also improves the mechanical running characteristics, i.e. it reduces friction and heating in the piston ring. The expansion coefficients and thermal conductivities of the cooperating metals should be matched to one another.

Other components which are directly exposed to the combustion gases can advantageously be provided with the coating, particularly valves and valve seats. Here, again, the coating with the chemically inert and low-wear metals prevents the formation of carbonyls and increases the service life. In addition, dangerous deposits of cleavage products of the combustion process are prevented and the operation of the valves and valve seats improved. The components can be entirely coated by means of the target process described hereinafter.

These and further features can be gathered from the claims, description and drawings and the individual features, both singly or in the form of subcombinations, can be implemented in an embodiment of the invention and in other fields and can represent advantageous, independently protectable constructions for which protection is hereby claimed.

BRIEF DESCRIPTION OF THE DRAWINGS

Embodiments of the invention are described in greater detail hereinafter relative to the drawings, wherein shown.

DETAILED DESCRIPTION OF PREFERRED EMBODIMENTS

Figure 1A:
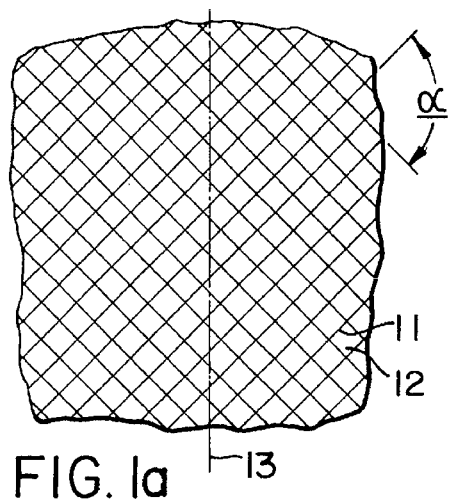
FIG. 1a The machining tracks of a conventional honing operation on a machined surface.
Figure 1B:
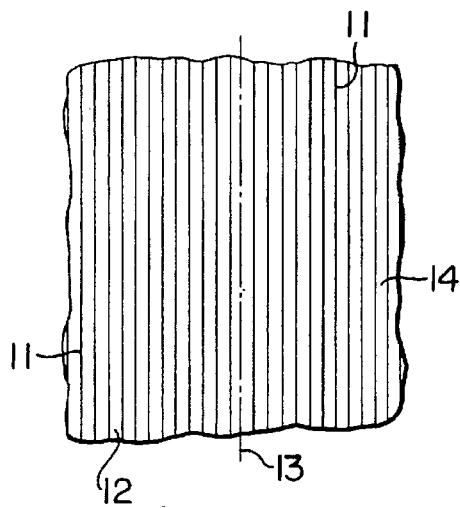
FIG. 1b The machining tracks of a cylinder inner face machined according to the invention.

Conventional honing tools work a hole or bore with a hole or bore-filling tool in a superimposed rotary and lifting movement, the two movement components being roughly equal. Thus, on the workpiece surface are formed cross-like machining tracks, which cross at an angle a of approximately 45° to 90°, preferably 60° (FIG. 1). Conventionally during prehoning the angle is made larger, i.e. the circumferential and lifting speeds are roughly the same, whereas, for producing the final surface, the lifting speed is reduced compared with the circumferential speed, in order to improve the surface and avoid macro-imprecisions.

Figure 2:
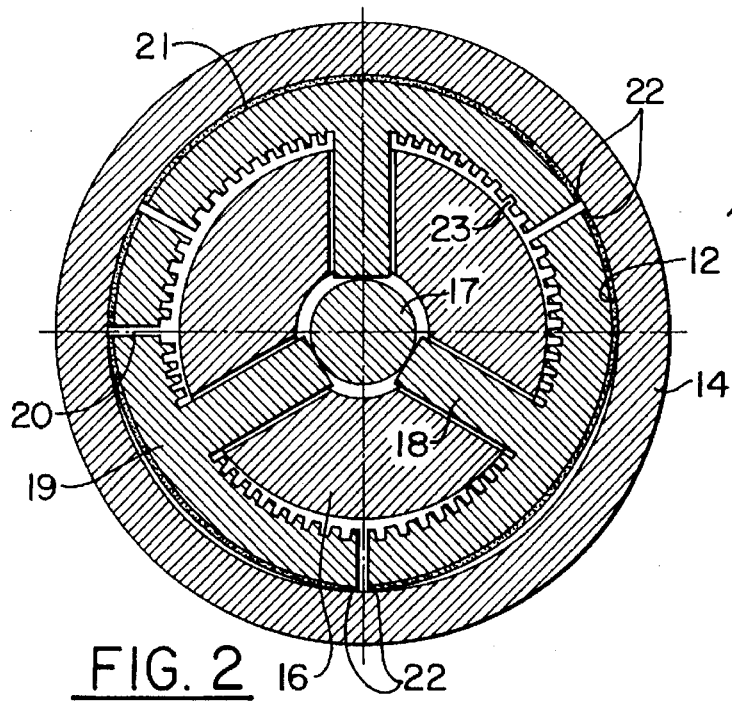
FIG. 2 diagrammatic cross-section through a honing tool.

The invention adopts the opposite procedure and proposes axial honing during the final honing process instead of with a larger circumferential component, so that finally machining tracks 11 are obtained on the workpiece surface 12, which are as parallel as possible to the axis 13 of the cylinder inner bore (FIG. 2). In the case of workpiece 13 it is a cylinder 14 of an internal combustion engine, which slidingly cooperates with a piston and piston rings located thereon. The machining tracks 11 on the surface 12 only have a depth of approximately 1 μm, because honing is a precision machining operation, but this determines the running-in and permanent behaviour.

Unlike in the case of conventional honing methods it is possible, according to the invention, to prehone with superimposed circumferential and honing movements and then the final machining takes place with an axial guidance of the honing tool. This is counter to the tendency of conventional honing methods. Thus, there is a more uniform action in the circumferential direction during prehoning and the surface structure with longitudinally directed machining tracks important for operation is produced in the following final machining process.

It is particularly preferable for honing to take place without any circumferential movement. However, improvements can still be obtained if the circumferential movement is very small, e.g. no more than 1/50 or even better 1/100 of the axial movement. Preferred machining speeds are approximately 10 to 50 m/min in the axial direction and preferably 15 to 30 m/min, whereas the circumferential speed should be below 1 (0.1) m/min. It is also possible for there to be a multistep or a stepless transition between the prehoning with circumferential movement and the final machining essentially without a circumferential movement, in that the circumferential speed is constantly reduced in stepwise or continuous manner. Through the superimposing of the machining tracks (cross and axial tracks), particularly if the prehoning with cross tracks takes place with a less fine abrasive medium coating, a "plateau effect" is obtained, i.e. the finer tool works on the surface of the underlying cross tracks and, as a result, creates an axial machining track path, whereas the remaining depressions from the prehoning process form oil pockets, should this be considered necessary.

As a result of the excellent sliding characteristics in conjunction with the piston rings running thereon it is possible to do without a deliberate oil retention on the cylinder surface, so that the oil bed is better scraped off and therefore less oil is burned in the combustion chamber.

FIG. 2 shows a honing tool, which is specifically provided for axial honing and as a segment tool. It has a tool body 16, in whose inner bore runs a widening cone 17, which by means of operating wedges 18 can adjust coating layer carriers, hereinafter called honing segments 19, for the bore-filling machining. The three honing segments provided in the embodiment are connected to one another with relatively small gaps 20.

The honing segments 19, which have a large surface, uninterrupted abrasive medium coating 21 in the circumferential direction, are resiliently constructed in such a way that they can give way resiliently in their outer areas 22 remote from the widening wedges 18. This resilience or elasticity is such that, even taking account of the force conditions resulting from the curvature of the segment, with the standard machining force a uniform force distribution is obtained over the entire segment face. In the present example the resilience is formed by rear notches 23 of the honing tool, which are essentially axially directed and, as a function of their spacing from the support by the wedges 18, can have varying depths. Other resilience possibilities are conceivable, e.g. by providing elastic intermediate layers.

The upper half of FIG. 2 shows the segments 19 applied to the wall of the bore or hole, whereas the lower half shows that the segments 19 are just starting to exert a pressing action. They therefore still have a smaller curvature than the bore wall and only adapt under the adjusting force.

Particular preference is given to abrasive medium coatings made from boron nitride (CBN) or diamond coatings in a metallic bond. It is also possible to use silicon carbide or corundum-containing ceramic or plastic coatings. This leads to cutting coatings adapting to the bore shape and which in particular compensate diameter tolerances. Inclined and/or arrow-shaped chip removal grooves can be provided circumferentially.

Provided that working is to take place with a precisely axial working direction, with said tool there is a stepwise circumferential displacement and for this purpose preferably the honing layers are briefly relieved by retracting the widening cone 17 before the honing tool is rotated on by an amount which is smaller than the width of the segments. Thus, all the circumferential areas are honed as uniformly as possible.

Figure 3:
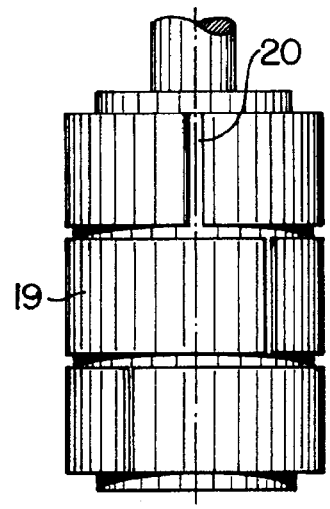
FIGS. 3 and 4 Diagrammatic side views of embodiments of honing tools.

In accordance with FIG. 3, it is also possible to have several segments in axial succession and to offset the gaps 20 between the segments. With a corresponding choice of the different gap widths a uniform machining can take place without any further rotation.

Figure 4:
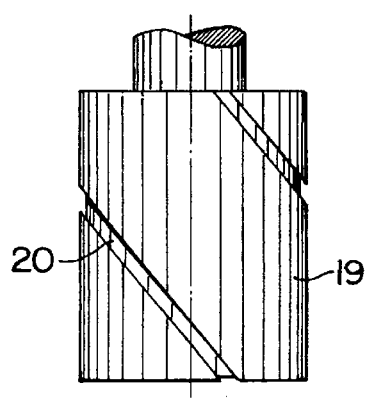

According to FIG. 4 it is also possible to build up the segments with inclined gaps 20 or arrow-shaped grooves, so that there is a better chip removal in the vicinity of the gaps.

Figure 5:
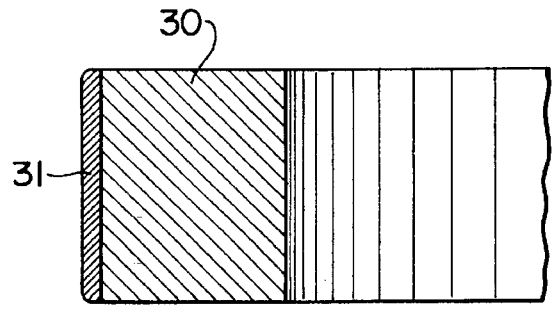
FIG. 5 A larger scale partial cross-section through a piston ring.

The cylinder tracks or paths machined according to the invention preferably cooperate with piston rings 30, which have a coating 31 (FIG. 5) on a conventional cast iron material with a hardness of e.g. 60 to 70 HRC.

The coating materials are, preferably, niobium, tungsten and zirconium, but titanium and tantalum are also suitable, whereas iridium, palladium and platinum have advantageous characteristics, but are very expensive.

When choosing materials, particular attention must be paid to the anti-adhesive and chemically inert characteristics, so that oil and oil carbon are not deposited and metal carbonyls are not formed. This would on the one hand remove the metal and would constitute pollutants.

Although the hardness of the piston ring coating normally exceeds that of the cylinder path (niobium at 49 HRC, zirconium at 60 HRC and tungsten at 72 HRC), there is a certain grinding-in process, in which the two cooperating surfaces adapt to one another. If preferably the surface of the piston rings is also given a final axial machining, e.g. by axial outer honing in the packet, then after a short running-in time there is an ideal adaptation, so that even with a small oil film thickness there is a hydraulic bearing and consequently a freedom from wear.

Even in the case of harder piston paths, e.g. due to boron nitride additives in the material or an embedding of silicon granules in a nickel coating, the coating still has an advantageous nature.

Coating takes place in vacuo by arc plasma coating, i.e. a so-called target coating.

Such a PVD arc process functions as follows. The workpieces are brought on a holding system into the machining chamber in which a high vacuum is produced. The coating is then heated to 200° to 400° C. and by sputtering an intense cleaning of the workpieces takes place. An arc then evaporates the cathode (target). As a result of this process there is a transformation of the cathode material from solid form into a high energy charged ionic vapour. The ionized material of zirconium, niobium or other metals, in conjunction with the introduced reactive gas (nitrogen) is deposited on the workpieces and combines with the carrier material.

The advantage of this PVD process (physical vapour deposition) compared with the CVD process (chemical vapour deposition) is that in the PVD process there is a hard material deposition at between 200° and 400° C., whereas in the CVD processs temperatures of 800° to 1100° C. are required for the chemical reaction and the results are less advantageous with respect to hardness, distortion, etc.

The flame-spraying process is also suitable for certain applications, but is less advantageous due to through porosity, lack of adhesion and rough surface. It also does not permit the application of inner faces and requires expensive after-working.

The coating thickness is only a few μm, e.g. between 5 and 15 μm, preferably 8 μm. The coating can be provided on all piston ring types. Conventionally, in the case of a motor vehicle engine there are three piston rings in axial succession, namely, considered from the combustion chamber, firstly a cambered ring, then a so-called minute ring, which has an inclined position widening from the combustion chamber with a magnitude of angular minutes, and then an oil scraping ring provided in a central groove. As a result of the excellent characteristics both of the ring and the correspondingly prepared bearing surface, optionally one of these rings can be omitted. The coating has the advantage that it compensates any unevennesses of the piston ring surface.

We claim:

1. Method for improving the cylinder structure of the working chambers of motors and machines by honing cylinder inner faces, wherein honing takes place in the form of axial honing without any significant circumferential machining movement, wherein working takes place with axial machining speeds between 10 and 50 m/min and circumferential speeds below 1 m/min.

2. The method according to claim 1 further including the steps of providing a honing tool for performing said honing, said honing tool containing adjustable cutting layer carriers provided with cutting layers and gaps therebetween said cutting layer carriers; and adapting the circumferential contour of the cutting layers to the contour of the surfaces to be worked.

3. The method according to claim 2, wherein said honing tool performs axial inner honing.

4. The method according to claim 2, wherein said adapting is performed by elastic construction of said cutting layer carrier being matched in such a way that the same machining pressure occurs over said cutting layer circumferential contour.

5. The method according to claim 4, wherein the cutting layer carriers are large surface honing segments each taking up more than ⅛ of the honing tool circumference.

6. The method according to claim 5, wherein said gaps between said cutting layer carriers are much smaller than the circumferential dimensions of the honing segments.

7. The method according to claim 4, wherein the cutting layer carriers are large surface honing segments each taking up more than ⅓ of the honing tool circumference.

8. The method according to claim 2, wherein said cutting layer carriers are formed elastically by notches on the side of shell-shaped honing segments remote from said cutting layer carriers.

9. The method according to claim 2, wherein said gaps between said cutting layer carriers are inclined to the axial direction.

10. The method according to claim 2, wherein at least two groups of said cutting layer carriers are successively axially arranged, in which, circumferentially, said gaps provided between said cutting layer carriers of one group are reciprocally displaced compared with those of the other group in the circumferential direction.

11. The method according to claim 1, wherein said cylinder inner faces preponderantly contain axially directed honing tracks.

12. The method according to claim 1, further including the steps of forming a coating material from a chemically inert, anti-adhesive metal; and coating at least said cylinder inner face facing said working chamber with said coating material.

13. The method according to claim 12, further including the step of coating said piston ring with said coating material on at least the side of said piston ring facing said cylinder inner faces, wherein said working chamber is an internal combustion engine having a valve body and a valve seat.

14. The method according to claim 13, further including the step of machining axially directed tracks that run on said cylinder inner face parallel to the axis of said piston ring.

15. The method according to claim 14, further including the step of cooperating said face of said piston ring with said cylinder inner faces.

16. The method according to claim 13, further including the step of coating said valve body with said coating material.

17. The method according to claim 13, further including the step of coating said valve seat with said coating material.

18. The method according to claim 12, wherein said coating material is formed from a metal of the fourth or fifth secondary group of the periodic system of elements or tungsten.

19. The method according to claim 12, wherein said coating material is either niobium or zirconium.

20. The method according to claim 12, wherein said coating material is applied in the target process (PVD arc process).

21. The method according to claim 1, wherein said axial machining speeds are between 15 and 30 m/min.

22. The method according to claim 1, wherein said circumferential speeds are below 0.1 m/min.

23. Method for improving the cylinder structure of the working chambers of motors and machines by honing cylinder inner faces, wherein honing takes place in the form of axial honing without any significant circumferential machining movement, including the steps of:

providing a honing tool for performing said honing, said honing tool containing adjustable cutting layer carriers provided with cutting layers and gaps therebetween said cutting layer carriers; and adapting the circumferential contour of the cutting layers to the contour of the surfaces to be worked, said honing tool performing axial inner honing;

said adapting being performed by elastic construction of said cutting layer carrier being matched in such a way that the same machining pressure occurs over said cutting layer circumferential contour;

the cutting layer carriers being large surface honing segments each taking up more than $\frac{1}{8}$ of the honing tool circumference; and said gaps between said cutting layer carriers being much smaller than the circumferential dimensions of the honing segments.

\* \* \* \* \*

UNITED STATES PATENT AND TRADEMARK OFFICE
CERTIFICATE OF CORRECTION

PATENT NO. : 5,655,955
DATED : August 12, 1997
INVENTOR(S) : Nagel et al.

It is certified that error appears in the above-indentified patent and that said Letters Patent is hereby corrected as shown below:

On title page, item [73]

In the Assignee Section: Nagel Maschinen und Werekzeugfabrik GmbH should read "Nagel Maschinen und Werkzeugfabrik GmbH"

Signed and Sealed this

Third Day of November, 1998

Attest:

BRUCE LEHMAN

Attesting Officer

Commissioner of Patents and Trademarks